(12) United States Patent
Shirlen

(10) Patent No.: US 10,216,671 B2
(45) Date of Patent: Feb. 26, 2019

(54) POWER AWARE ARBITRATION FOR BUS ACCESS

(71) Applicant: QUALCOMM Incorporated, San Diego, CA (US)

(72) Inventor: Martyn Shirlen, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 32 days.

(21) Appl. No.: 15/444,273

(22) Filed: Feb. 27, 2017

(65) Prior Publication Data

US 2018/0246829 A1    Aug. 30, 2018

(51) Int. Cl.
| | | |
|---|---|---|
| H03M 13/00 | (2006.01) |
| G06F 13/37 | (2006.01) |
| H03M 13/19 | (2006.01) |
| G06F 13/16 | (2006.01) |
| G06F 13/38 | (2006.01) |

(52) U.S. Cl.
CPC .......... *G06F 13/37* (2013.01); *G06F 13/1663* (2013.01); *G06F 13/385* (2013.01); *H03M 13/19* (2013.01); *Y02D 10/14* (2018.01); *Y02D 10/151* (2018.01)

(58) Field of Classification Search
CPC ............................... G06F 13/37; H03M 13/19
See application file for complete search history.

(56) References Cited

U.S. PATENT DOCUMENTS

| | | | |
|---|---|---|---|
| 6,243,779 B1 * | 6/2001 | Devanney | G06F 13/4068 326/21 |
| 7,373,462 B2 | 5/2008 | Blumrich et al. | |
| 8,341,332 B2 | 12/2012 | Ma et al. | |
| 9,264,368 B2 | 2/2016 | Swarbrick et al. | |
| 9,304,953 B2 | 4/2016 | Zain et al. | |
| 2006/0184595 A1 * | 8/2006 | Tschanz | G06F 13/4213 708/200 |
| 2009/0172226 A1 * | 7/2009 | Kulkarni | G06F 13/1652 710/240 |
| 2011/0149977 A1 * | 6/2011 | Thomas | H04L 47/524 370/395.41 |
| 2015/0347015 A1 | 12/2015 | Pawlowski | |

FOREIGN PATENT DOCUMENTS

| | | |
|---|---|---|
| WO | 2006000944 A1 | 1/2006 |
| WO | 2012088464 A1 | 6/2012 |

OTHER PUBLICATIONS

International Search Report and Written Opinion—PCT/US2018/017905—ISA/EPO—dated May 11, 2018.

\* cited by examiner

*Primary Examiner* — Samir W Rizk
(74) *Attorney, Agent, or Firm* — Muncy, Geissler, Olds & Lowe, P.C./Qualcomm

(57) ABSTRACT

Systems and methods for operating a bus interface unit include queues for receiving and storing one or more words from one or more agents for transmission on to a data bus. From at least a subset of the one or more words, a next word which will cause the least switching power among the subset of the one or more words when transmitted on to the data bus is determined and the next word is selected for transmission on to the data bus, to reduce dynamic power consumption of the data bus. The next word may be selected as a word among the subset of the one or more words with a least Hamming distance from a current word scheduled for transmission on to the data bus.

23 Claims, 5 Drawing Sheets

POWER AWARE ARBITRATION FOR BUS ACCESS

FIELD OF DISCLOSURE

Disclosed aspects are directed to a data bus. More specifically, exemplary aspects are directed to reducing power consumption for transmission of data on the data bus by one or more agents coupled to the data bus through a bus interface unit.

BACKGROUND

Processing systems may employ different bus architectures for transport of data between different components. Depending on particular applications and implementations, the bus architectures may include topologies such as a ring, mesh, star, etc. as known in the art, and various protocols and standards may be followed for sending and receiving data on the buses.

One or more agents such as processors, caches, etc. may be coupled to a data bus. In some implementations, one or more agents may be connected to the data bus through a bus interface unit such as a switch unit. The bus interface units may include arbiters to manage data traffic sent on to the data bus from the one or more agents and the data traffic received from the data bus for consumption by the one or more agents. For instance, a bus interface unit may employ one or more queues, also referred to as virtual channels, for storing requests from the one or more agents. When more than one request is pending, arbitration techniques are employed to select requests to be sent out.

One consideration for the arbitration techniques is to reduce power consumption. As will be recognized for processing applications involving servers, mobile systems on chips (SoCs), battery powered and handheld devices, etc., there is an ever increasing need to reduce power consumption. In the case of data buses for such processing applications, e.g., high performance bus networks traversing long distances, wide wire bundles between different switch units, etc., dynamic power contributes a significant portion of the overall power consumption. Thus, there are techniques employed in the art for reducing dynamic power consumption of data buses.

One such technique is referred to as bus invert coding, wherein either an outstanding word from a virtual channel or the inverse of the word, whichever one of the two would result in the least amount of switching activity on the data bus, is selected by a bus interface unit connected to the virtual channel, to be transmitted on to the data bus. Bus invert coding seeks to minimize switching activity and thus reduce power consumption. In implementations of these techniques, a state bit or similar information is also sent along with the transmission from the bus interface unit, to indicate whether the transmission is of the originally intended word from the virtual channel or the inverse of the word. Accordingly, such techniques involve adding wires for the state bit and additional control signaling, and in cases where the wires cross chip or package boundaries, adding additional pins and input/output ports.

Furthermore, techniques such as bus invert coding do not take into account the switching power of more than one word. Thus, if there are multiple outstanding words for transmission from multiple virtual channels connected to the bus interface unit, a conventional arbiter may resort to a work-conserving round robin approach in selecting words from the multiple virtual channels, which does not take into account switching power considerations across the multiple words. For example, two consecutive words transmitted from the bus interface unit based on the round robin approach may be apart from each other by a high switching distance, referred to as a Hamming distance in the art. The high Hamming distance can lead to a high switching power, thus increasing the dynamic power consumption of the transmission of the words on the data bus.

Accordingly, there is a need in the art for improved arbitration techniques for reducing dynamic power consumption of data buses, while avoiding the aforementioned limitations of the known approaches discussed above.

SUMMARY

Exemplary aspects are directed to systems and methods for operating a bus interface unit. One or more words from one or more agents are received at the bus interface unit for transmission on to a data bus. From at least a subset of the one or more words, a next word which will cause the least switching power among the subset of the one or more words when transmitted on to the data bus is determined and the next word is selected for transmission on to the data bus, to reduce dynamic power consumption of the data bus. The next word may be selected as a word among the subset of the one or more words with a least Hamming distance from a current word scheduled for transmission on to the data bus.

For example, an exemplary aspect is directed to a method of operating a bus interface unit. The method comprises receiving one or more words from one or more agents for transmission on to a data bus. The method includes determining, from at least a subset of the one or more words, a next word which will cause the least switching power among the subset of the one or more words when transmitted on to the data bus, and selecting the next word for transmission on to the data bus.

Another exemplary aspect is directed to an apparatus comprising a data bus, one or more agents, and a bus interface unit. The bus interface unit is configured to receive one or more words from the one or more agents for transmission on to the data bus, determine, from at least a subset of the one or more words, a next word which will cause the least switching power among the subset of the one or more words when transmitted on to the data bus, and select the next word for transmission on to the data bus.

Yet another exemplary aspect is directed to an apparatus comprising means for receiving one or more words from one or more agents for transmission on to a data bus, means for determining, from at least a subset of the one or more words, a next word which will cause the least switching power among the subset of the one or more words when transmitted on to the data bus, and means for selecting the next word for transmission on to the data bus.

Another exemplary aspect is directed to a non-transitory computer readable storage medium comprising code, which, when executed by a processor, causes the processor to perform a method of operating a bus interface unit. The non-transitory computer readable storage medium comprises code for receiving one or more words from one or more agents for transmission on to a data bus, code for determining, from at least a subset of the one or more words, a next word which will cause the least switching power among the subset of the one or more words when transmitted on to the data bus, and code for selecting the next word for transmission on to the data bus.

BRIEF DESCRIPTION OF THE DRAWINGS

The accompanying drawings are presented to aid in the description of aspects of the invention and are provided solely for illustration of the aspects and not limitation thereof.

DETAILED DESCRIPTION

Figure 1:
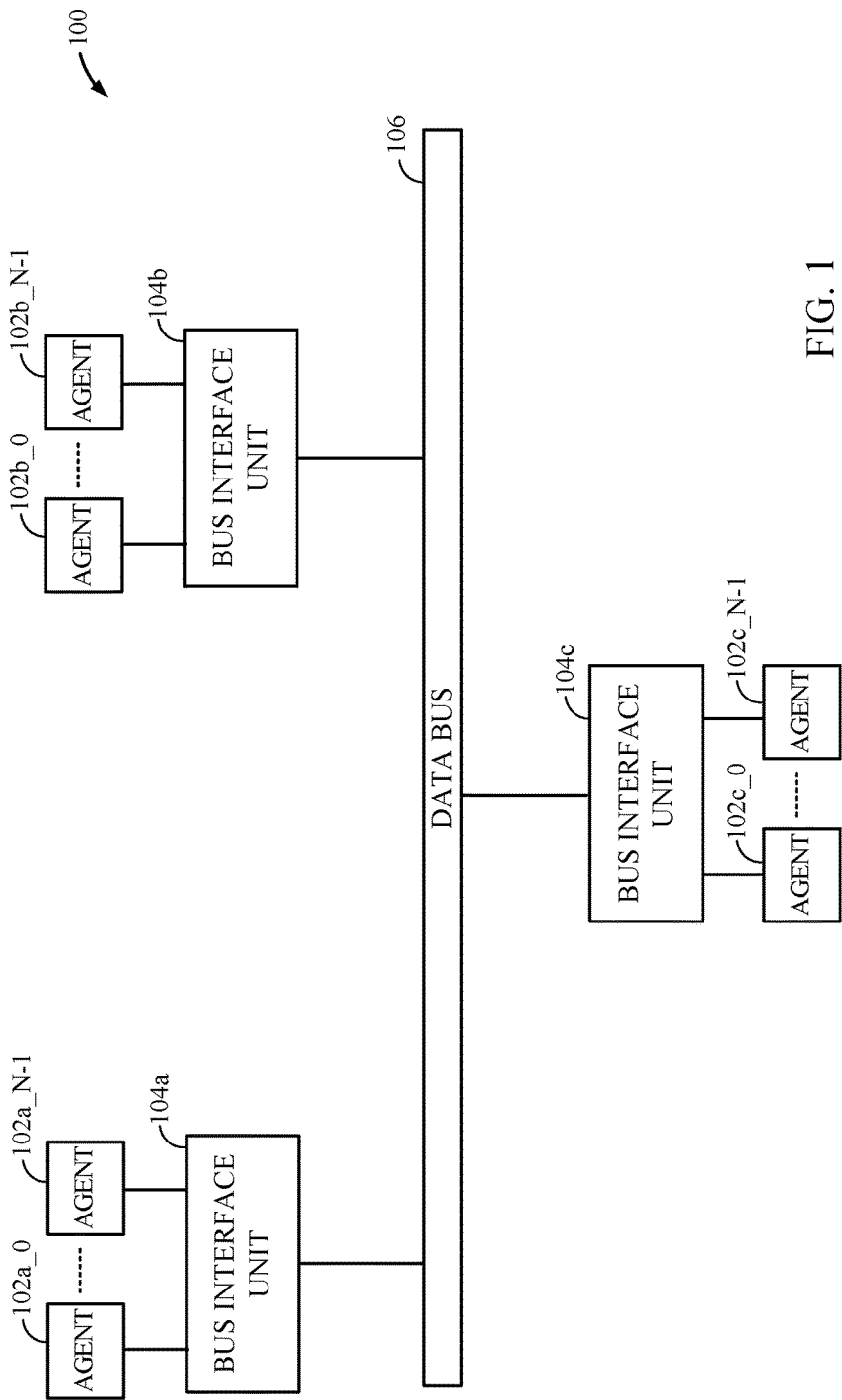
FIG. 1 illustrates a processing system with a data bus, configured according to aspects of this disclosure.

Aspects of the invention are disclosed in the following description and related drawings directed to specific aspects of the invention. Alternative aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

In exemplary aspects of this disclosure, dynamic power consumption on a data bus is reduced. In an aspect, one or more agents (e.g., processors, caches, etc.) may be connected to the data bus through bus interface units. At an example bus interface unit, one or more virtual channels may store pending transactions or requests for transmission of words from one or more agents. An arbiter may be configured to select as a future word for transmission on the data bus, a word among the pending words which would have the least switching power or the lowest Hamming distance from a current word scheduled for transmission (or in some implementations, a previously transmitted word). In this manner, back to back transmissions of the future word and the current word would incur low switching power, leading to a reduction in the dynamic power consumption of the data bus.

In exemplary aspects, the selection of words for transmission by the arbiter may be work-conserving or non-work-conserving, but directed to reducing power consumption. As such, in some aspects, the exemplary arbitration techniques may be integrated with a work-conserving round robin approach, but a strict round robin order may not be followed in some cases where lower switching power can result from selecting a future word which would not be next in a round robin order.

In one implementation of the exemplary aspects, a current word to be transmitted on to the data bus by the bus interface unit may be maintained in an output register or pipeline stage. Hamming distances between the current word and one or more pending words in one or more virtual channels which are ready for transmission may be calculated. The pending word which has the least Hamming distance is selected by a multiplexor as the next word to be transmitted from the bus interface unit on to the data bus.

With reference now to FIG. 1, aspects of an exemplary processing system 100 are depicted. Specifically, data bus 106 is shown, connected to various agents through bus interface units. Data bus 106 may be any network, interface, set of wires, or system bus and be configured to transport data, or more generally, "words" in various directions according to various protocols known in the art. In this disclosure, the terms "data", "word", "data word", etc., are used to convey any type of digital information which may be transported. In some aspects, the term "word" conveys a quantum or block of binary bits transported in one transaction. As such, a word, in this disclosure may include, without limitations, any digital information such as data, control information, address information, etc. Furthermore, although not illustrated, the configuration of data bus 106 may be according to topologies such as star, ring, mesh, etc., as known in the art.

In an example depiction, N agents (e.g., 102a_0-102a_N–1; 102b_0-102b_N–1; 102c_0-102c_N–1) are shown to be connected to each of bus interface units 104a-c, wherein bus interface units 104a-c interface data bus 106. The number of agents connected to each bus interface units can vary, and the particular illustration is merely for ease of explanation of example aspects. The agents 102a_0-102a_N–1; 102b_0-102b_N–1; and 102c_0-102c_N–1 shown in FIG. 1 may comprise one or more elements such as a processor (e.g., a processor core, a central processing unit (CPU), a general purpose processor (GPU), digital signal processor (DSP), etc.), a cache (e.g., L1, L2, L3 caches), a bridge unit, a repeater, a direct memory access (DMA) controller, a memory controller, etc. These agents may transmit words to data bus 106 by making requests to respective bus interface units 104a-c to which the agents are connected to. Similarly, bus interface units 104a-c may receive words from data bus 106 and forward the received words to the intended recipients among the agents connected to respective bus interface units 104a-c. A particular example of words to be transmitted to data bus 106 by one or more of the N agents connected to one of bus interface units 104a-c will now be discussed with reference to FIG. 2.

Figure 2:
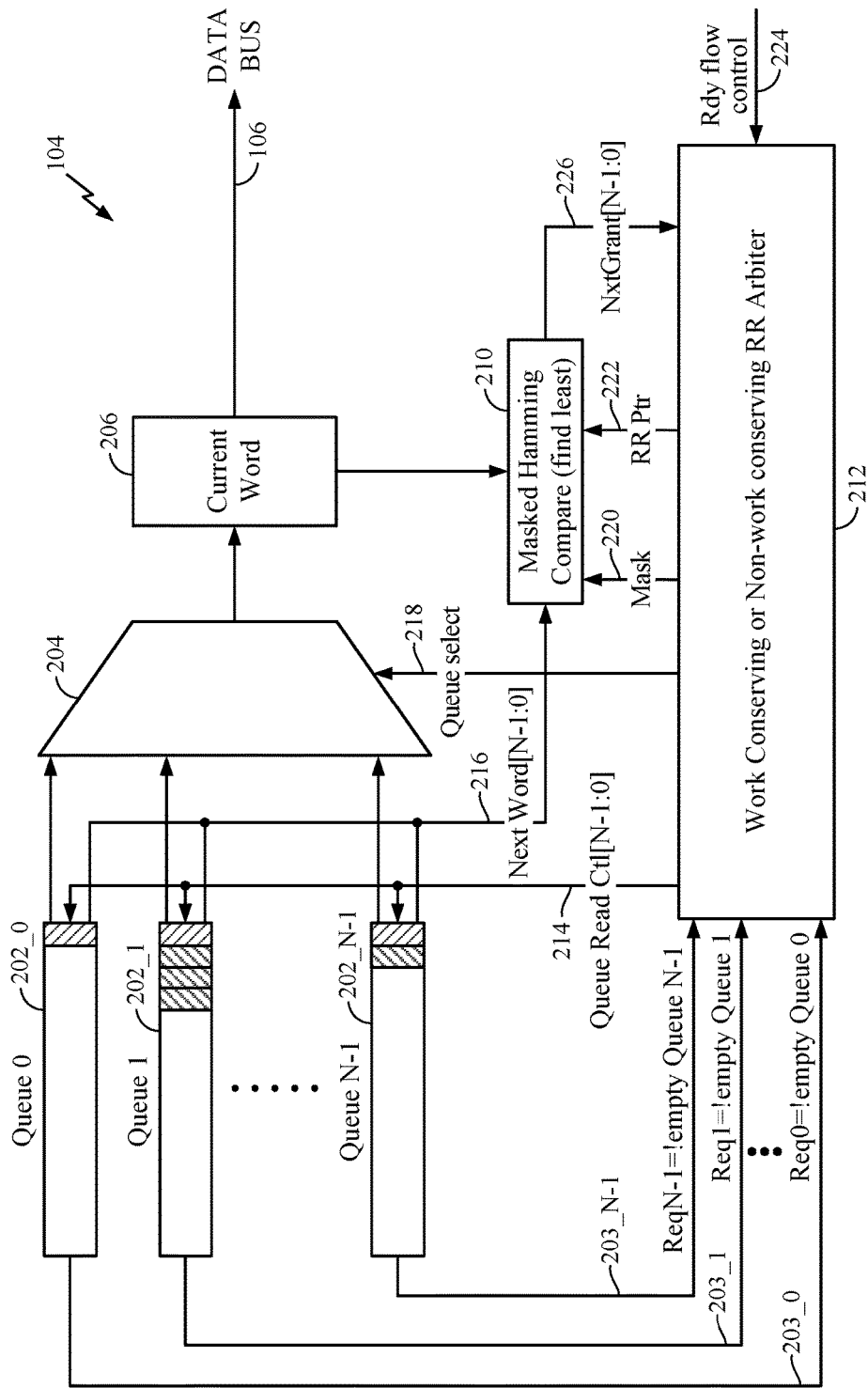
FIG. 2 illustrates an implementation of a bus interface unit configured according to exemplary aspects of this disclosure.

In FIG. 2, a detailed view of one of bus interface units 104a-c, generally depicted by the reference numeral 104, is shown. Words to be transmitted from the N agents connected to bus interface unit 104 are first placed in the N queues 0-N-1 depicted by the reference numerals 202_0-202_N-1. The N queues may also be referred to as virtual channels. Although a one-to-one correspondence is shown between the N agents and the N queues, it will be understood that this is not a requirement, and words from more than one agent may feed into a queue and/or words from the same agent can be received by more than one queue.

As shown, as words are received from the N agents (e.g., 102a_0-102a_N-1 for bus interface unit 104a) for transmission on to data bus 106, the words are placed in queues 0-N-1 202_0-202_N-1. Further, when a word is pending in a queue, a corresponding request is made to arbiter 212 of bus interface unit 104. For each one of queues 0-N-1 202_0-202_N-1, a corresponding request 0-N-1 203_0-203_N-1 is asserted when there is at least one pending word, or put another way, when the corresponding queue 0-N-1 202_0-202_N-1 is not empty. An example implementation of arbiter 212 will be discussed in further detail in FIG. 3. Arbiter 212 may implement, in part, a round robin arbitration which may be work-conserving or non-work-conserving, and in conjunction with Hamming compare block 210, one of the words in the up to N queues 0-N-1 202_0-202_N-1 may be selected and a corresponding word may be selected for transmission by multiplexor 204. In this regard, if there are more than one pending words in one or more of the up to N queues 0-N-1 202_0-202_N-1, in a lowest dynamic work function scheme (in conjunction with the round robin implementation which will be discussed in further detail below), only the pending words at the top of each of the up to N queues 0-N-1 202_0-202_N-1 (e.g., the word corresponding to the oldest request in the respective queue) may be considered. In another implementation, referred to as a fixed quantum scheme, all pending words in each of the up to N queues 0-N-1 202_0-202_N-1 which have pending words may be considered (once again, in conjunction with the round robin implementation which will be discussed in further detail below).

With continued reference to FIG. 2, for each pending request from queues 0-N-1 202_0-202_N-1, the corresponding one or more words (depending on whether only the word at the top of the queue is considered or if all pending words of a queue are considered) is provided to Hamming compare block 210 as next word 216. Arbiter 212 provides a current round robin (RR) pointer 222 to Hamming compare block 210, wherein RR pointer 222 provides an indication of queues 0-N-1 202_0-202_N-1 from which requests are yet to be compared if a round robin order is to be maintained among the N queues in conjunction with selecting a next word with the least Hamming distance. Thus, out of the requests from the up to N queues 0-N-1 202_0-202_N-1 which may be pending, only the requests from queues which are remaining in a round robin order, as indicated by RR pointer 222 are considered.

The word which was previously selected for transmission on to data bus 106 by bus interface unit 104 is stored in the register (or a pipeline stage) shown as current word 206. Hamming compare block 210 then calculates the Hamming distance between the N words of next word 216 corresponding to the remaining requests indicated by RR pointer 202 and current word 206. Of these, the next word 216 with the least Hamming distance from current word 206 is provided as next grant 226 to arbiter 212. Arbiter 212 uses next grant 226 in conjunction with its round robin protocol and provides select signal 218 to multiplexor 204, based on which, multiplexor 204 selects a corresponding word of the remaining requests in round robin order from one of queues 0-N-1 202_0-202_N-1 as the next word to be transmitted on to data bus 106 in the next cycle or iteration. The next word output by multiplexor 204 has the least Hamming distance from the word stored in the register current word 206, which ensures that the transmission of current word 206 followed by transmission of the next word in the following cycle would incur the least switching power. In this manner, dynamic power of data bus 106 is reduced by taking into account the switching power which would be involved in the transmission of all pending words from the N queues 0-N-1 202_0-202_N-1.

In some cases for implementing a work-conserving scheme, queues 0-N-1 202_0-202_N-1, which have a corresponding request 0-N-1 203_0-203_N-1 granted in a particular round of arbitration in arbiter 212 are masked off until they are revisited in a round robin order. Mask 220 is provided by arbiter 212 to indicate requests which are to be masked off. Only words which are not masked may be used in the calculation of Hamming distance from current word 206 in Hamming compare block 210. Correspondingly, Hamming compare block 210 is represented as masked Hamming compare block 210 in FIG. 2.

Furthermore, in some cases, an external control signal shown as ready flow control 224 may be provided to arbiter 212 to flexibly enable the above-described features of taking into account the switching power of the pending requests in the arbitration process employed by arbiter 212. If these features are not enabled, arbiter 212 can default to a work-conserving or non-work-conserving round robin protocol in its arbitration among the up to N pending requests.

Figure 3:
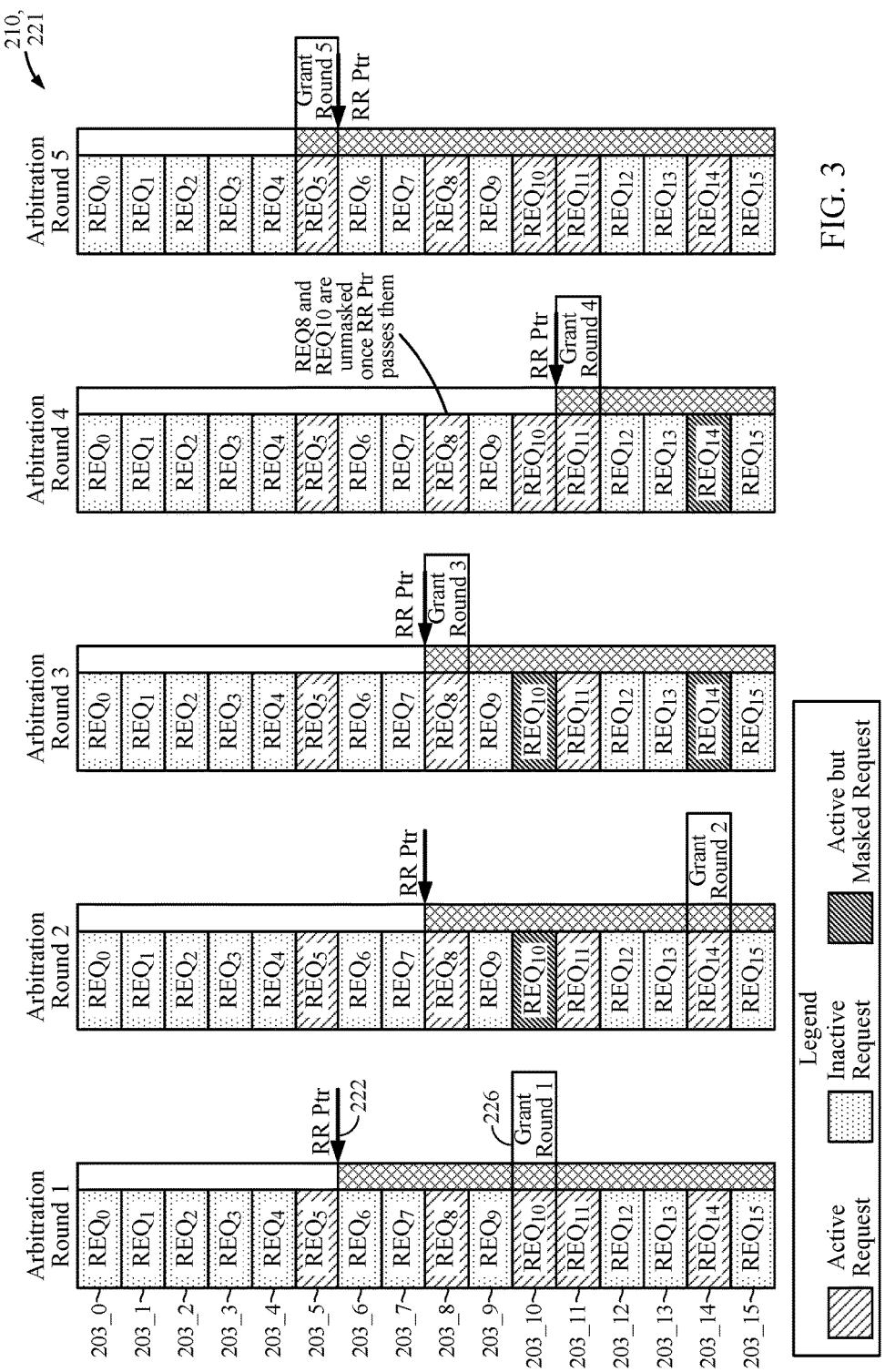
FIG. 3 illustrates aspects of an exemplary arbitration process according to this disclosure.

With combined reference now to FIGS. 2-3, exemplary aspects of selecting a next word for transmission using arbiter 212 in conjunction with Hamming compare block 210 is shown in greater detail. FIG. 3 shows several rounds 1-5 of arbitration for an example case where N=16, i.e., there are may be requests for words to be transmitted from up to 16 queues 202_0-202_15 of FIG. 2. A representative request is shown as request 0 203_0 to request 15 203_15 for each of the 16 queues 202_0-202_15, respectively. For each request 0-15 203_0-203_15 shown as being active, the corresponding queues 202_0-202_15 may include at least one word; if a request 0-15 203_0-203_15 is shown as being inactive, there may be no pending words to be transmitted in a corresponding queue 202_0-202_15; and if a request 0-15 203_0-203_15 is shown as being masked, there may be pending words to be transmitted in a corresponding queue 202_0-202_15 but the queue has been masked. RR pointer 222 traverses, in a round robin order, sequentially through requests from the up to 16 queues, from request 0 203_0 to request 15 203_15 before returning to the top of the order to request 0 203_0. In FIG. 3, words from queues corresponding to requests below the location pointed by RR pointer 222 may be selected according to exemplary techniques based on the Hamming distance to current word 206 (as explained in FIG. 2) in each arbitration round, while words from queues corresponding to requests above RR pointer 222 may not be selected in that arbitration round. The request which is granted based on the least Hamming distance by Hamming compare block 210 is shown as next grant 226 for each round of arbitration. Rounds 1-5 of arbitration shown in FIG. 3 will now be explained in greater detail below.

Starting with Round 1, RR pointer 222 is seen to be below request 5 203_5, which means that pending/ready requests among requests 6-15 203_6-203_15 can be selected for the next grant. In the example depiction of Round 1, request 10 203_10 is determined by Hamming compare block 210 to have the least Hamming distance (e.g., considering all pending words in queues with active requests in a fixed quantum (1) scheme or considering only the pending word at the top of a queue in a lowest dynamic work function value for a variable quantum scheme) with current word 206 among requests 6-15 203_6-203_15. Thus, next grant 226 is provided for request 10 203_10, and subsequently, queue 202_10 from which request 10 203_10 emanated is masked off, which means that if there is another request ready from queue 202_10 before RR pointer 222 completes a full cycle, then the next request 10 203_10 will not be considered, which allows the round robin order to be preserved.

Referring to Round 2, RR pointer 222 is seen to have moved to point to the next active request 8 203_8 among the remaining requests 6-15 203_6-203_15 in the previous Round 1. In Round 2, requests 8-15 203_8-203_15 will be considered (with request 10 203_10 masked off) for calculating the least Hamming distance from the current word 206 (which would have been updated to request 10 203_10 corresponding to next grant 226 in the previous Round 1). Based on the least Hamming distance, request 14 203_14 is selected for next grant 226 in Round 2. Correspondingly, queue 202_14 which generated request 14 203_14 will be treated as a masked queue or is masked off going into Round 3.

In Round 3, RR pointer 222 stays at request 8 203_8 since request 8 203_8 was not granted in Round 2 (thus, choosing the least Hamming distance in favor of a strict round robin order). In Round 3, request 8 203_8 is seen to have the least Hamming distance with current word 206 (which would now have been updated to request 14 203_14 from the previous Round 2) among the remaining active requests of requests 8-15 203_8-203_15, and so next grant 226 is provided for request 8 203_8 in Round 3 and queue 202_8 which generated request 8 203_8 is masked off going into Round 4.

In Round 4, RR pointer 222 moves to the next active request below request 8 203_8, which is request 11 203_11 (since request 10 203_10 was masked off). However, it is noted that once RR pointer 222 passes request 8 203_8 and request 10 203_10, the masks on request 8 203_8 and request 10 203_10 may be removed as a full round robin cycle is considered to be traversed from the perspective of request 8 203_8 and request 10 203_10 and for the next round, if there is an active request on queue 202_8 and/or queue 202_10, the corresponding request 8 203_8 and request 10 203_10 may be considered for the next grant. In Round 4, request 11 203_11 is the only active request among the remaining requests 11-15 203_11-203_15 and as such is provided the next grant 226 by default. RR pointer 222 then moves to the next active request from the top, to preserve a work-conserving round robin scheme.

Round 5 may start off with providing next grant 226 to request 5 203_5 to preserve an overall round robin order since Round 1 started below request 5 203_5, since otherwise, request 5 203_5 can be skipped over in favor of a remaining request with a lower Hamming distance and never have a chance to be provided a grant. Thus, to ensure that each active request gets at least one opportunity for a grant, in some cases, such as in Round 5, the round robin scheme may be favored over a scheme which selects the next grant based on the least Hamming distance. Subsequently, following rounds of arbitration may proceed in similar manner, taking into account the considerations discussed in the above examples of Rounds 1-5 of arbitration.

Additionally, in some aspects, it may be possible to categorize words in queues 202_0-202_N−1 of FIG. 2 into categories such as data, control information, address information, etc. In some implementations, words pertaining to control information or partial addresses (e.g., more significant or an upper portion of an address) may remain constant across sequential transactions. This can be understood by considering consecutive instructions pertaining to memory accesses from sequential locations, for example. Thus, in such cases where it is determinable based on the type of words that there may not be significant switching power involved in sequential transactions from some queues, power savings gains may be realized by not considering words from these queues in the determination of Hamming distances in Hamming compare block 210, for example. Rather, queues with words such as data or full addresses which may have a higher probability of exhibiting variations (and thus, possibly higher Hamming distances) may be considered in Hamming compare block 210.

Figure 4:
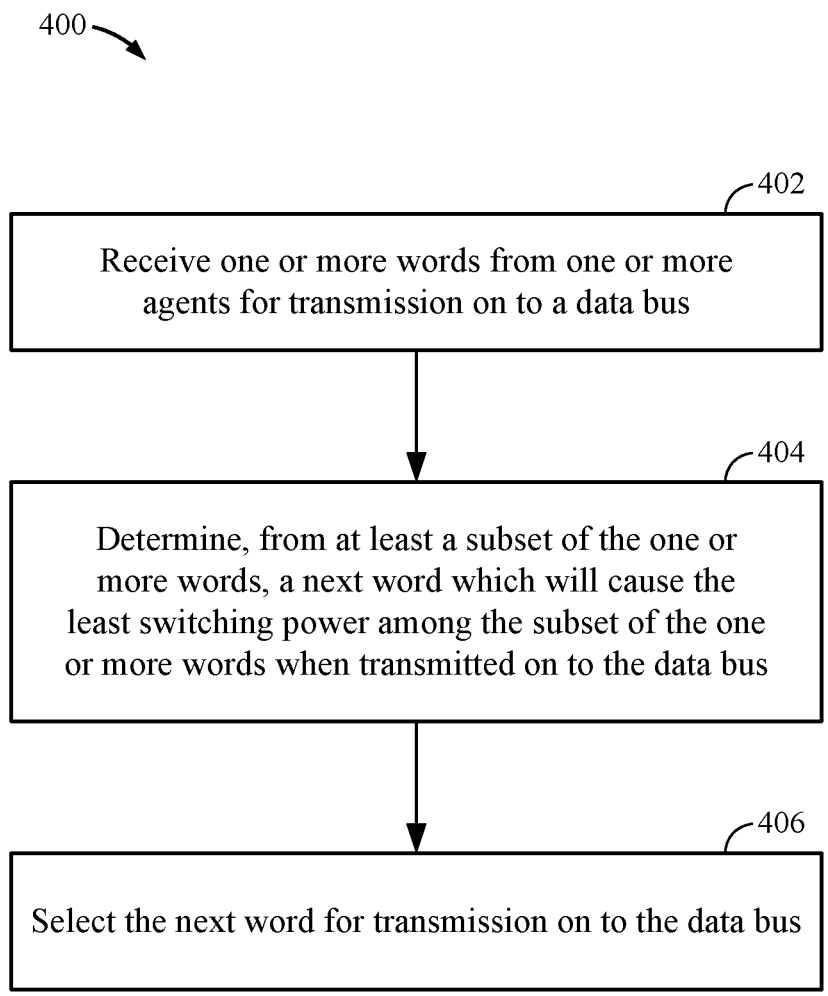
FIG. 4 illustrates a flow chart of a method of operating a bus interface unit according to disclosed aspects.

Accordingly, it will be appreciated that exemplary aspects can include various methods for performing the processes, functions, or algorithms disclosed herein. For example, as illustrated in FIG. 4, an exemplary aspect can include a method (400) of operating a bus interface unit (e.g., bus interface unit 104).

Block 402 comprises receiving one or more words from one or more agents (e.g., N agents 102a_0-102a_N−1) for transmission on to a data bus (e.g., data bus 106).

Block 404 comprises determining, from at least a subset of the one or more words (e.g., based on remaining words in a round robin order), a next word (e.g., pertaining to next grant 226) which will cause the least switching power among the subset of the one or more words when transmitted on to the data bus. For example, the next word is determined as a word among the subset of the one or more words with a least Hamming distance from a current word (e.g., current word 206) scheduled for transmission on to the data bus, wherein the least Hamming distance may be based on a fixed quantum scheme or a lowest dynamic work function value for a variable quantum scheme. In further detail, the one or more words received from the one or more agents may be stored in one or more queues (e.g., N queues 202_0-202_N−1), wherein the subset of the one or more words are selected based on a round robin order of the one or more queues. Implementing the round robin order may include maintaining a round robin pointer (e.g., RR pointer 222) for traversing queues with a pending word in sequential order (e.g., from queue 0 202_0 to queue N−1 202_N−1 arranged from top to bottom in sequential order), and selecting the subset of the one or more words from queues of higher sequential order than a location of the round robin pointer (i.e., the remaining requests below the RR pointer 222) in each of one or more rounds of arbitration. Further, in some aspects a queue corresponding to the next word selected for transmission in a round may be masked for a subsequent round, and not selected until the round robin pointer has traversed a full cycle of all the queues.

Block 406 comprises selecting the next word (e.g., based on next grant 226 used in providing select 218 to multiplexor 204) for transmission on to the data bus. In some aspects, the current word scheduled for transmission may be stored in a register (e.g., current word 206), prior to transmission on to the data bus.

Figure 5:
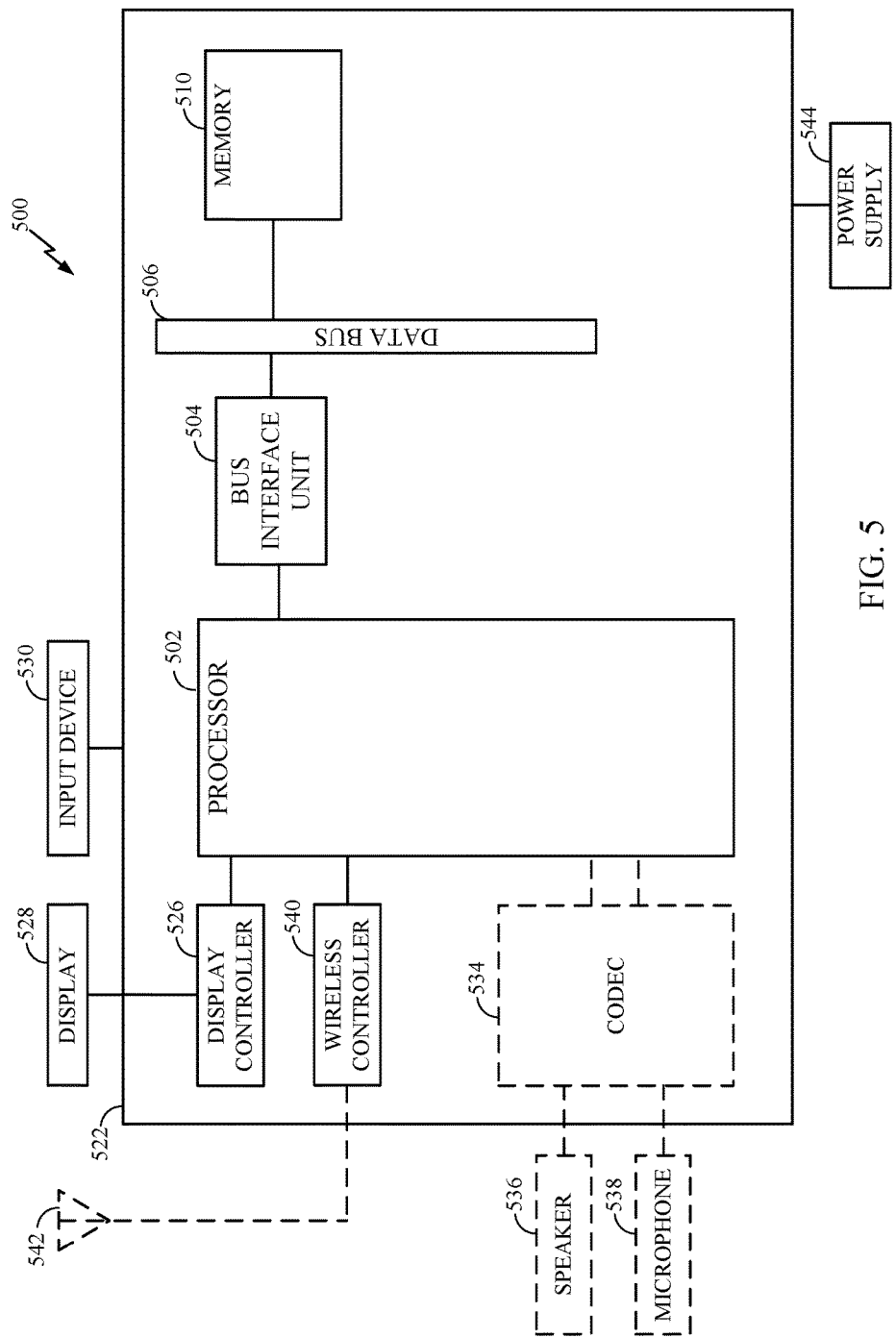
FIG. 5 depicts an exemplary computing device in which an aspect of the disclosure may be advantageously employed.

An example apparatus in which exemplary aspects of this disclosure may be utilized, will now be discussed in relation to FIG. 5. FIG. 5 shows a block diagram of computing device 500. Computing device 500 may correspond to an exemplary implementation of a processing system which may be configured to implement method 400 of FIG. 4. In the depiction of FIG. 5, computing device 500 is shown to include processor 502 connected to data bus 506 through bus interface unit 504. Data bus 506 may have similar functionality as data bus 106 of FIG. 1 and bus interface unit 504 may be similarly configured as bus interface units 104*a*-*c* of FIG. 1, to receive one or more words from agents including at least processor 502 and to select a word for transmission on to data bus 506 according to method 400 of FIG. 4 in some cases. Data bus 506 is shown to be coupled to memory 510 in FIG. 5, but this is merely for the sake of illustration, and any other configuration (e.g., with one or more levels of caches between processor 502 and memory 510) may be supported by computing device 500.

FIG. 5 also shows display controller 526 that is coupled to processor 502 and to display 528. In some cases, computing device 500 may be used for wireless communication and FIG. 5 also shows optional blocks in dashed lines, such as coder/decoder (CODEC) 534 (e.g., an audio and/or voice CODEC) coupled to processor 502 and speaker 536 and microphone 538 can be coupled to CODEC 534; and wireless antenna 542 coupled to wireless controller 540 which is coupled to processor 502. Where one or more of these optional blocks are present, in a particular aspect, processor 502, display controller 426, memory 110, and wireless controller 540 are included in a system-in-package or system-on-chip device 522.

Accordingly, a particular aspect, input device 530 and power supply 544 are coupled to the system-on-chip device 522. Moreover, in a particular aspect, as illustrated in FIG. 5, where one or more optional blocks are present, display 528, input device 530, speaker 536, microphone 538, wireless antenna 542, and power supply 544 are external to the system-on-chip device 522. However, each of display 528, input device 530, speaker 536, microphone 538, wireless antenna 542, and power supply 544 can be coupled to a component of the system-on-chip device 522, such as an interface or a controller.

It should be noted that although FIG. 5 generally depicts a computing device, processor 502 and memory 510, may also be integrated into a set-top box, a music player, a video player, an entertainment unit, a navigation device, a personal digital assistant (PDA), a fixed location data unit, a server, a computer, a laptop, a tablet, a communications device, a mobile phone, or other similar devices. More generally, processor 502 and memory 510, may also be integrated into at least one semiconductor die.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect of the invention can include a computer readable media embodying a method for reducing dynamic power consumption of a data bus.

Accordingly, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A method of operating a bus interface unit, the method comprising:
   receiving three or more words from one or more agents for transmission on to a data bus;
   storing the three or more words in three or more respective queues, wherein the three or more respective queues are indexed to a predetermined sequential order;
   selecting a subset of the three or more respective queues based on a position of a round robin pointer (RRP) having a RRP value that traverses the three or more queues in accordance with the predetermined sequential order, wherein the subset:
      excludes queues having an index value lower than the RRP value; and
      includes queues having an index value higher than the RRP value;
   identifying a plurality of pending words stored in the selected subset of the three or more queues;
   determining which of the plurality of pending words stored in the selected subset will consume the least switching power;
   selecting, based on the determining, a next word from the plurality of pending words stored in the selected subset of the three or more queues; and
   transmitting the selected next word on to the data bus.

2. The method of claim 1, wherein determining which of the plurality of pending words will consume the least switching power comprises:
   determining which of the plurality of pending words is associated with a smallest Hamming distance from a current word scheduled for transmission on to the data bus.

3. The method of claim 2, comprising determining the least Hamming distance based on a fixed quantum scheme or a lowest dynamic work function value for a variable quantum scheme.

4. The method of claim 2, comprising storing the current word scheduled for transmission in a register, prior to transmission on to the data bus.

5. The method of claim 1, comprising masking a queue corresponding to the next word selected for transmission, and not selecting a word from the masked queue until the round robin pointer has traversed a full cycle of all the queues.

6. An apparatus comprising a data bus, one or more agents, and a bus interface unit, wherein the bus interface unit is configured to:
   receive three or more words from the one or more agents for transmission on to the data bus;
   store the three or more words in three or more respective queues, wherein the three or more respective queues are indexed to a predetermined sequential order;
   select a subset of the three or more respective queues based on a position of a round robin pointer (RRP) having a RRP value that traverses the three or more queues in accordance with the predetermined sequential order, wherein the subset:
      excludes queues having an index value lower than the RRP value; and
      includes queues having an index value higher than the RRP value;
   identify a plurality of pending words stored in the selected subset of the three or more queues;
   determine which of the plurality of pending words stored in the selected subset of the three or more queues will consume the least switching power;
   select, based on the determining, a next word from the plurality of pending words stored in the selected subset of the three or more queues; and
   transmit the selected next word on to the data bus.

7. The apparatus of claim 6, wherein the bus interface unit comprises:
   a register configured to store a current word scheduled for transmission on to the data bus;
   a Hamming compare block configured to determine which of the plurality of pending words is associated with a smallest Hamming distance from a current word scheduled for transmission on to the data bus;
   an arbiter configured to receive the indication of the next word and provide a select signal; and
   a multiplexor configured to select the next word from the subset of the three or more words based on the select signal.

8. The apparatus of claim 7, wherein the Hamming compare block is configured to determine the least Hamming distance based on a fixed quantum scheme or a lowest dynamic work function value for a variable quantum scheme.

9. The apparatus of claim 7, wherein the arbiter is configured to receive an indication of queues which have a pending word.

10. The apparatus of claim 6, wherein the arbiter is further configured to mask a queue comprising the next word selected for transmission.

11. The apparatus of claim 10, wherein the arbiter is further configured to provide the select signal such that a word from the masked queue is not selected until the round robin pointer has traversed a full cycle of all the queues.

12. The apparatus of claim 6, wherein the apparatus is integrated in at least one semiconductor die.

13. The apparatus of claim 6, wherein the apparatus is integrated in a device selected from the group consisting of a set-top box, a music player, a video player, an entertainment unit, a navigation device, a personal digital assistant (PDA), a fixed location data unit, a server, a computer, a laptop, a tablet, a communications device, and a mobile phone.

14. An apparatus comprising:
   means for receiving three or more words from one or more agents for transmission on to a data bus;
   means for storing the three or more words received from the one or more agents in three or more respective queues, wherein the three or more respective queues are indexed to a predetermined sequential order;
   means for selecting a subset of the three or more respective queues based on a position of a round robin pointer (RRP) having a RRP value that traverses the three or more queues in accordance with the predetermined sequential order, wherein the subset:
      excludes queues having an index value lower than the RRP value; and
      includes queues having an index value higher than the RRP value;
   means for identifying a plurality of pending words stored in the selected subset of the three or more queues;
   means for determining which of the plurality of pending words stored in the selected subset of the three or more queues will consume the least switching power;
   means for selecting, based on the determining, a next word from the plurality of pending words stored in the selected subset of the three or more queues; and
   means for transmitting the selected next word on to the data bus.

15. The apparatus of claim 14, wherein the means for determining which of the plurality of pending words will consume the least switching power comprises:
   means for determining which of the plurality of pending words is associated with a smallest Hamming distance from a current word scheduled for transmission on to the data bus.

16. The apparatus of claim 15, comprising means for determining the least Hamming distance based on a fixed quantum scheme or a lowest dynamic work function value for a variable quantum scheme.

17. The apparatus of claim 15, comprising means for storing the current word scheduled for transmission, prior to transmission on to the data bus.

18. The apparatus of claim 14, further comprising means for masking a means for storing the three or more words comprising the next word selected for transmission.

19. A non-transitory computer readable storage medium comprising code, which, when executed by a processor, causes the processor to perform a method of operating a bus interface unit, the non-transitory computer readable storage medium comprising:
   code for receiving three or more words from one or more agents for transmission on to a data bus;

code for storing the three or more words received from the one or more agents in three or more respective queues, wherein the three or more respective queues are indexed to a predetermined sequential order;

code for selecting a subset of the three or more respective queues based on a position of a round robin pointer (RRP) having a RRP value that traverses the three or more queues in accordance with the predetermined sequential order, wherein the subset:
   excludes queues having an index value lower than the RRP value; and
   includes queues having an index value higher than the RRP value;

code for identifying a plurality of pending words stored in the selected subset of the three or more queues;

code for determining which of the plurality of pending words stored in the selected subset of the three or more queues will consume the least switching power;

code for selecting, based on the determining, a next word from the plurality of pending words stored in the selected subset of the three or more queues; and code for transmitting the selected next word on to the data bus.

20. The non-transitory computer readable storage medium of claim 19, wherein the code for determining which of the plurality of pending words will consume the least switching power comprises:
   code for determining which of the plurality of pending words is associated with a smallest Hamming distance from a current word scheduled for transmission on to the data bus.

21. The non-transitory computer readable storage medium of claim 20, comprising code for determining the least Hamming distance based on a fixed quantum scheme or a lowest dynamic work function value for a variable quantum scheme.

22. The non-transitory computer readable storage medium of claim 20, comprising code for storing the current word scheduled for transmission in a register, prior to transmission on to the data bus.

23. The non-transitory computer readable storage medium of claim 19, comprising code for masking a queue corresponding to the next word selected for transmission, and code for not selecting a word from the masked queue until the round robin pointer has traversed a full cycle of all the queues.

\* \* \* \* \*